US010523197B2

United States Patent
Botti et al.

(10) Patent No.: US 10,523,197 B2
(45) Date of Patent: Dec. 31, 2019

(54) SWITCH CIRCUIT, CORRESPONDING DEVICE AND METHOD

(71) Applicant: STMicroelectronics S.r.l., Agrate Brianza (MB) (IT)

(72) Inventors: Edoardo Botti, Vigevano (IT); Giovanni Gonano, Padua (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/261,267

(22) Filed: Jan. 29, 2019

(65) Prior Publication Data

US 2019/0238130 A1  Aug. 1, 2019

(30) Foreign Application Priority Data

Jan. 31, 2018 (IT) .................. 102018000002257

(51) Int. Cl.
*H03K 17/687* (2006.01)
*H03F 3/217* (2006.01)
*H03K 17/10* (2006.01)

(52) U.S. Cl.
CPC ....... *H03K 17/6874* (2013.01); *H03F 3/2171* (2013.01); *H03K 17/102* (2013.01); *H03K 2217/0009* (2013.01)

(58) Field of Classification Search
CPC ............ H03K 17/687; H03K 17/6874; H03K 17/107; H03K 17/127; H03K 17/689;

(Continued)

(56) References Cited

U.S. PATENT DOCUMENTS 4,953,068 A    8/1990 Henze
6,108,218 A    8/2000 Igarashi et al.
(Continued)

FOREIGN PATENT DOCUMENTS

CN    201018423 Y    2/2008
CN    101814840 A    8/2010
WO    2009153965 A1    12/2009

OTHER PUBLICATIONS

Andreycak, B, "Zero Voltage Switching Resonant Power Conversion", Unitrode Application Note, U-138, 5 Sep. 1999, pp. 3-329-3-356.

(Continued)

*Primary Examiner* — John W Poos
(74) *Attorney, Agent, or Firm* — Slater Matsil, LLP (57) ABSTRACT

A bi-directional switch circuit includes first and second transistors having their control electrodes coupled at a first common node and the current paths coupled at a second common node in an anti-series arrangement. First and second electrical paths coupled between the first common node and the first and second transistors, respectively, include first and second switches switchable between a conductive state and a non-conductive state. A third electrical path between the first and second common nodes includes a third switch switchable between a conductive state and a non-conductive state. The third switch is coupled with the first and second switches by a logical network configured to switch the third switch to the conductive state with the first and second switches switched to the non-conductive state, and to the non-conductive state with either one of the first and second switches switched to the conductive state.

22 Claims, 3 Drawing Sheets (58) Field of Classification Search
CPC ............... H03K 17/785; H03K 17/122; H03K 17/6871; H03F 1/0211; H03F 2200/03; H03F 3/187; H03F 3/2173; H03F 3/217
USPC ................................................ 327/427, 434
See application file for complete search history.

(56) References Cited

U.S. PATENT DOCUMENTS

| | | | |
|---|---|---|---|
| 7,199,640 B2* | 4/2007 | De Cremoux | H03K 17/063 327/365 |
| 8,026,704 B2 | 9/2011 | Kapels et al. | |
| 8,942,018 B2 | 1/2015 | Ho et al. | |
| 9,985,546 B2 | 5/2018 | Jitaru | |
| 10,122,359 B2* | 11/2018 | Janssens | H03K 17/6874 |
| 2002/0126509 A1 | 9/2002 | Liang | |
| 2007/0115055 A1 | 5/2007 | Mendenhall | |
| 2008/0143421 A1 | 6/2008 | Yanagihara et al. | |
| 2010/0219878 A1* | 9/2010 | Kihara | H03K 17/6874 327/437 |
| 2012/0057387 A1 | 3/2012 | Lai et al. | |
| 2012/0218785 A1 | 8/2012 | Li et al. | |
| 2013/0154391 A1* | 6/2013 | Urciuoli | H03K 17/081 307/112 |
| 2015/0023063 A1 | 1/2015 | Perreault et al. | |
| 2015/0069855 A1 | 3/2015 | De Rooij et al. | |
| 2015/0381168 A1* | 12/2015 | Uejima | H03K 17/687 455/78 |
| 2016/0020701 A1 | 1/2016 | Jitaru | |

OTHER PUBLICATIONS

Choi, Hang-Seok, et al., "Novel Zero-Voltage and Zero-Current-Switching (ZVZCS) Full-Bridge PWM Converter Using Coupled Output Inductor", Browse Journals & Magazines, IEEE Transactions on Power Electronics, vol. 17, No. 5, Sep. 2002, pp. 641-648.
Choi, Hang-Seok, et al., "Novel Zero-Voltage and Zero-Current-Switching (ZVZCS) Full-Bridge PWM Converter Using Coupled Output Inductor", Department of Electrical Engineering, Seoul National University, Seoul, Korea, Nov. 7, 2002, pp. 967-973.
Dudrik, J. et al., "High-Frequency Soft-Switching DC-DC Converters for Voltage and Current DC Power Sources", Department of Electrical, Mechatronic and Industrial Engineering, Acta Polytechnica Hungarica, vol. 4, No. 2, Aug. 2007, pp. 29-46.
Walters, E.A., "Analysis of the Auxiliary Resonant Commutated Pole Inverter", XP055506334, Purdue University, Purdue e-Pubs, ECE Technical Reports, Electrical and Computer Engineering, Jan. 8, 1995, 67 pages.
Perdul'Ak, J. et al., "Novel Zero-Voltage and Zero-Current Switching Full-Bridge Pwm Converter Using Simple Secondary Active Clamp Circuit", Dept. of Electrical Engineering, Mechatronics and Industrial Engineering, FEI TU of Kosice, Slovak Republic, SCYR 2010—10th Scientific Conference of Young Researchers—FEI TU of Kosice, Oct. 23-26, 2010, 4 pages.
Texas Instruments, "Phase-Shifted Full Bridge DC/DC Power Converter Design Guide", TIDU248—May 2014, 56 pages.
Texas Instruments, "Phase-Shiffied Full-Bridge, Zero-Voltage Transition Design Considerations", Application Report, Literature No. SLUA07A, Sep. 1999—Revised Aug. 2011, 19 pages.

* cited by examiner

SWITCH CIRCUIT, CORRESPONDING DEVICE AND METHOD

CROSS-REFERENCE TO RELATED APPLICATIONS

This application claims priority to Italian Patent Application No. 102018000002257, filed on Jan. 31, 2018, which application is hereby incorporated herein by reference.

TECHNICAL FIELD

The present invention relates generally to an electronic system and method, and, in particular embodiments, to a switch circuit, corresponding device and method.

BACKGROUND

Various technical applications involve power switches intended to act as an open circuit or a closed circuit according to a control voltage, with the capability of handling currents of the order of, e.g., 1 to 10 A.

These switches are expected to be able to operate indifferently with currents flowing through the switch in either direction, possibly with floating terminals which, unlike conventional HSD and LSD arrangements, may not comprise terminals connected to ground or a positive supply rail.

So-called SIMO (Single Inductor Multiple Load) arrangements where n loads are supplied sequentially by using n power switches with floating terminals are exemplary of a possible use of these switches.

Another possible field of application is with resonance converters, where switches play the role of auxiliary switches for the resonating circuit.

Circuits comprising transistors, e.g., metal-oxide semiconductor (MOS) transistors in an anti-series (back-to-back) arrangement are often used, possibly with mutually-connected source terminals, with the capability of driving the respective gates with a single control signal.

Two (MOS) transistors may be used in that case insofar as the diodes between the drain and the source terminals would prevent switching to an open (non-conductive) state in a polarization condition, that is when the diode is in direct (forward) conduction.

Such an arrangement has the advantage of a reduced DC power dissipation insofar as the drop across the switch is given by the sum of the "on" resistances Rds(on) of the two transistors.

In certain applications, especially when high switching frequencies come into play, acting on the gate of just one of the two transistors (that is, using the other transistor in the pair as a diode) may be advantageous: even if conduction losses may be higher, the voltage drop related to Rds(on) is generally lower than the voltage drop related to a diode in direct (forward) conduction.

Oftentimes, when reverse polarization is applied to a MOS transistor, using the intrinsic diodes between drain and source may be advantageous.

In the case of MOS transistors with a high BVdss (e.g., higher than 20 V) the rapid shutdown of these diodes when in operation may lead to an appreciable extra-current caused by the charge stored, a phenomenon known as "reverse recovery current" of the body-source diode of the switch in direct conduction.

Especially in high-frequency switching systems, this phenomenon may limit performance or even possibly prevent satisfactory operation.

By referring (just by way of example) to switches comprising solid-state components manufactured with a BCD (Bipolar-CMOS-DMOS) process, in the presence of a current to be switched of the order of, e.g., 1 A, the extra current peak may be as a high as 10 A with corresponding Vds voltages of the order of 10 V, which leads to (very) high power dissipation.

SUMMARY

Some embodiments reduce the reverse recovery current peak.

One or more embodiments may relate to power switch circuits comprising MOS transistors.

One or more embodiments may relate to a corresponding device, such as a switching (class-D) switching amplifier.

One or more embodiments may relate to a corresponding method.

One or more embodiments may comprise two (power) transistors (e.g., MOS transistors) arranged back-to-back (anti-series arrangement) with a common source and common gate adapted to be switched-on (made conductive) by connecting the common gate to the drain of either one of the transistors in the pair, as a function of the current direction.

In one or more embodiments, the transistor (e.g., MOS transistor) polarized in a reverse mode may reduce considerably the current on its intrinsic diode.

In addition to a reduction in the reverse recovery peak, one or more embodiments may exhibit a simple-to-drive structure.

While possibly exhibiting a drop across the switch terminals higher in comparison with conventional solutions, one or more embodiments may lead to (considerably) lower power dissipation at high switching frequencies in comparison with conventional arrangements due to the almost complete absence of reverse recovery current.

One or more embodiments may provide one or more of the following advantages:

reduction of current peaks during switching, e.g., at switch-off; as noted, these peaks may be detrimental to operation or performance of a device comprising the switch;

especially at relatively high switching frequencies (e.g., higher than 1 MHz) and/or with a reduced turn-on times of the switch (e.g., less than 100 ns) an appreciable reduction in dissipated power can be achieved with an increased efficiency; and designing the switch driver circuitry is made appreciably simpler.

BRIEF DESCRIPTION OF THE DRAWINGS

One or more embodiments will now be described, by way of example only, with reference to the annexed figures, where.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 designates as a whole a switch circuit suited to be included in an electrical line between two nodes Va, Vb in an electrical device D.

A switching (class-D) amplifier may be exemplary of such a device. One such switching amplifier, suited for use in car audio system operating at a switching frequency of the order of 2 MHz, is disclosed in Italian Patent Application No. 102018000002255, filed on Jan. 31, 2018, in the name of the same applicant, which application is hereby incorporated herein by reference.

High-efficiency regulators and various types of BCD products may be further exemplary of devices where embodiments can be used.

The circuit 10 as exemplified in the figures comprises a first transistor M1 and a second transistor M2. MOS transistors may be exemplary of such transistors.

The two transistors M1, M2 are arranged with their control terminals (gates, in the case of field effect transistors such as MOS transistors) coupled at a first common node A.

The two transistors M1, M2 are also coupled with their current paths (source-drain, in the case of a field effect transistors such as MOS transistor) coupled at a second common node B in an anti-series arrangement.

The designation "anti-series" (also referred to as "back-to-back" connection) indicates a series connection where polarized components (bipoles) have their homologous terminals mutually coupled. For instance, two diodes can be connected in an anti-series (or back-to-back) arrangement by mutually connecting their cathodes and accessing the series connection via their anodes or, vice versa, by mutually connecting their anodes and accessing the series connection via the cathodes.

In the exemplary case discussed herein, the two transistors M1, M2 are coupled in an anti-series (back-to-back) arrangement by having their current-generating terminals (sources, in the case of a field-effect transistor such as a MOS transistor) mutually connected and by accessing the series connection (e.g., at Va, Vb) via the current-sink terminals (here, the drain terminals of M1, M2).

An alternative anti-series arrangement may comprise two transistors coupled via their current-sink terminals (drains, in the case of field effect transistors such as MOS transistors) and accessing the series connection via the current-generating terminals (sources in the case of field effect transistors such as MOS transistors).

Figure 1:
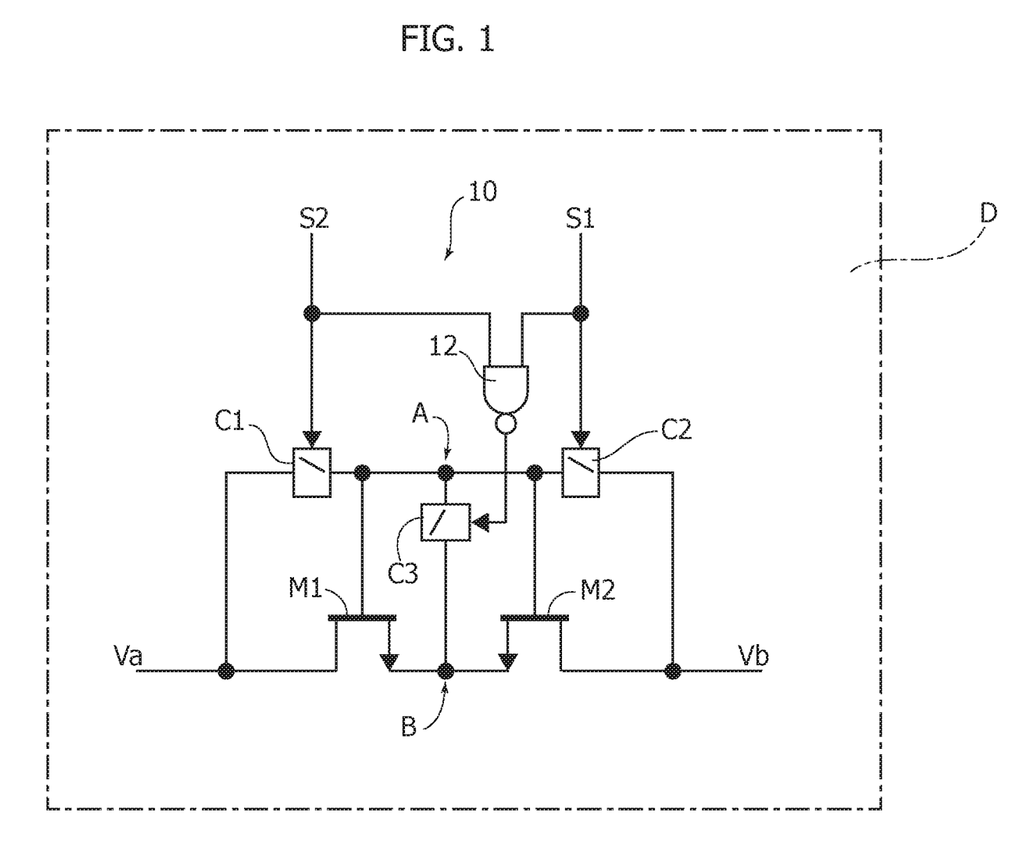
FIG. 1 is a diagram of embodiments.

In one or more embodiments as exemplified in FIG. 1, a first electrical path is provided between the first common node A and the current path through the first transistor M1 at the terminal of the first transistor M1 opposed the second transistor M2, that is at the current-sink terminal (here drain) of M1.

A first switch C1 is provided in the first electrical path, with the first switch C1 adapted to be switched (under the control of a control signal applied at a control node S2) between a conductive state and a non-conductive state.

In one or more embodiments as exemplified in FIG. 1, a second electrical path is provided between the first common node A and the current path through the second transistor M2 at the terminal of the second transistor M2 opposed the first transistor M1, that is at the current-sink terminal (here again drain) of M2.

A second switch C2 is provided in the second electrical path, with the second switch C2 adapted to be switched (under the control of a control signal applied at a control node S1) between a conductive state and a non-conductive state.

In one or more embodiments as exemplified in FIG. 1, a third electrical path is provided between the first common node A and the second common node B with a third switch C3 set in the third electrical path and the switchable between a conductive state and a non-conductive state.

Switching of the third switch C3 is controlled starting from the control terminals S1, S2 via a logic circuit (e.g., a NAND gate 12) having its inputs coupled to the first and second control nodes S2, S1, respectively. In such an arrangement the third switch C3 will thus be in a conductive state (thus coupling the two common nodes A, B) when both the first switch C1 and the second switch C2 are in the non-conductive state.

Conversely, the third switch C3 will be in the non-conductive state if either one of the first switch C1 and the second switch C2 is in the conductive state.

Figure 2:
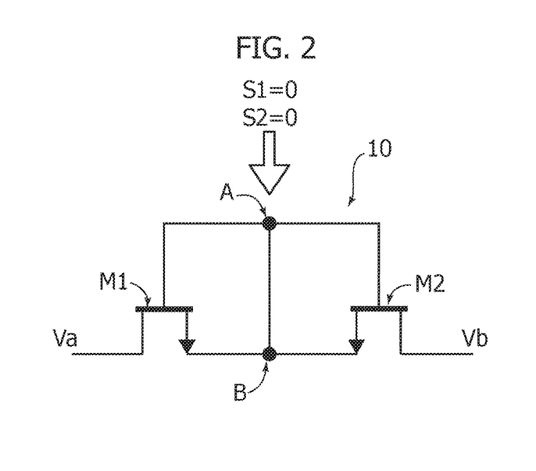
FIGS. 2-4 are exemplary of various operating conditions of a circuit corresponding to the diagram of FIG. 1.

FIG. 2 is exemplary of a possible operative condition of the switch circuit 10 of FIG. 1 where:

both switches C1, C2 are in an open (non-conductive) state so that the first common node A is de-coupled (separated) with respect to the nodes Va, Vb, the third switch C3 is turned-on (that is, made conductive) thereby coupling the two common nodes A, B.

In the condition exemplified in FIG. 2 the electrical line between Va, Vb is thus non-conductive insofar as no appreciable current can flow between Va, Vb (in either direction).

In the condition exemplified in FIG. 2, the circuit 10 (considered as a whole as a switch) will thus be in an "open" state (that is, non-conductive).

Figure 3:
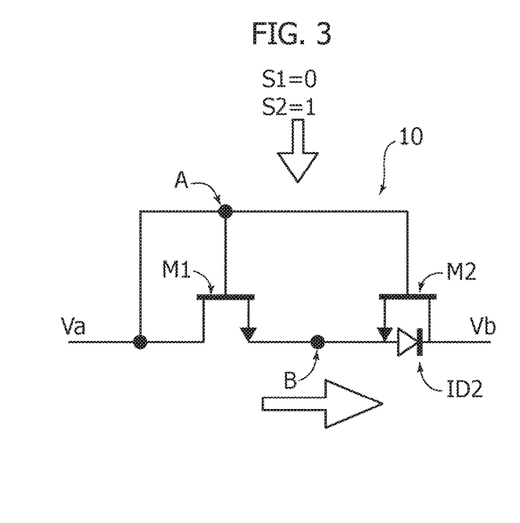

FIG. 3 is exemplary of an operating condition of the circuit 10 where the switch C1 is conductive (e.g., as a result of S2=1), and the second switch C2 non-conductive (e.g., as a result of S1=0).

In the condition exemplified in FIG. 3, the third switch C3 will be in an open (non-conductive) state so that the two common nodes A, B will be mutually de-coupled (that is, mutually isolated).

In the condition exemplified in FIG. 3, current will be able to flow from Va towards Vb (that is from left to right in FIG. 3) through the transistor M1 having its drain shorted to the gate (node A) and the intrinsic diode ID in M2 with the MOS polarized in the reverse mode acting to reduce the current therethrough.

Figure 4:
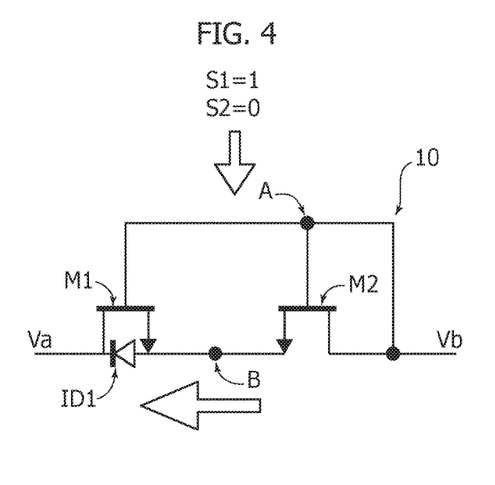

FIG. 4 is exemplary of an operating condition of the circuit 10 where the switch C1 is non-conductive (e.g., as a result of S2=0), and the second switch C2 conductive (e.g., as a result of S1=1).

In the condition exemplified in FIG. 4 the third switch C3 will be again in an open (non-conductive) state so that the two common nodes A, B will be mutually de-coupled (that is, mutually isolated).

In the condition exemplified in FIG. 4, current will be able to flow from Vb towards Va (that is from right to left in FIG. 4) through the transistor M2 having its drain shorted to the gate (node A) and the intrinsic diode ID in M1 with the MOS polarized in the reverse mode acting to reduce the current therethrough.

Figure 5:
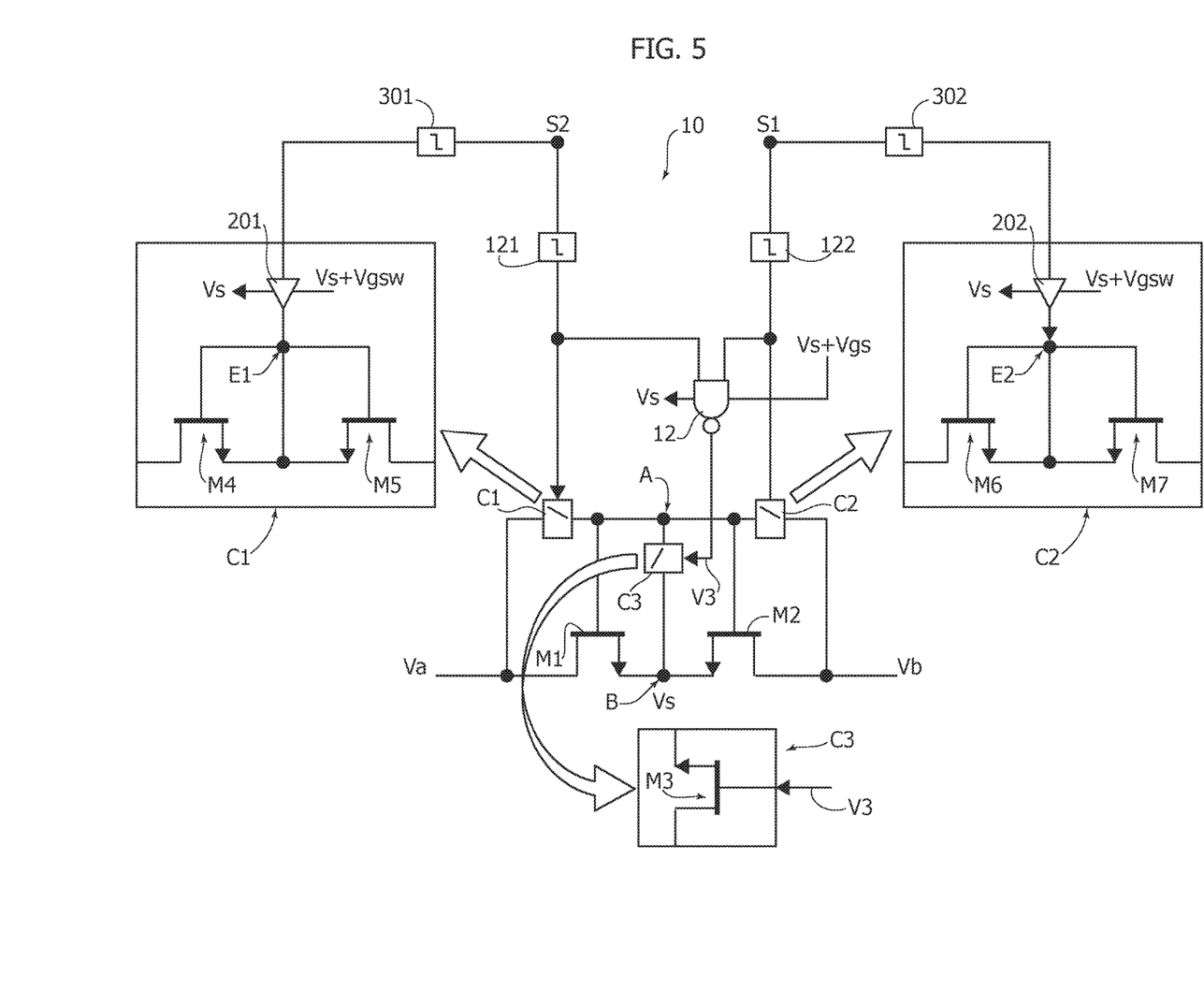
FIG. 5 is exemplary of possible implementation details of embodiments.

In FIG. 5, parts or elements like parts or elements already discussed in connection with FIGS. 1 to 4 are indicated with like references/numbers, so that a corresponding detailed description will not be repeated here for brevity.

FIG. 5 is exemplary of various implementation options of embodiments. For the sake of brevity, in FIG. 5 these options are exemplified in combination, being otherwise understood that these options need not necessarily be adopted in combination. One or more embodiments may thus adopt these details/features individually and/or in different combinations with respect to the combination exemplified in FIG. 5.

For instance, in one more embodiments, the switch C3 (intended to keep "turned off" the Vgs voltages in the power transistors M1, M2) can be implemented by using a single "signal" transistor, e.g., a single N-channel MOS transistor which can be driven with a voltage V3 between 0 and Vgs referred to the common node B between the (sources of) transistors M1, M2 at a voltage Vs.

In one or more embodiments, the logic gate 12 can be supplied with a voltage referred to Vs. For instance, the logic signals from the nodes S1, S2 (assumed to be referred to a 0 level) may be shifted from Vs to Vs+Vgs via level shifter circuits 121, 122 (of any known type).

In one or more embodiments, the first switch C1 and the second switch C2 can comprise two "signal" (that is, low-power) transistors (e.g., MOS transistor pairs M4, M5 and M6, M7) in an anti-series (back-to-back) arrangement, e.g., with common sources and common gates (see e.g., nodes E1 and E2).

Such an arrangement facilitates avoiding the activation of a current flow path between Va and Vb through the body diodes of the power transistors M1, M2 (which would militate against obtaining the "open" condition of the switch 10 as exemplified in FIG. 2).

In one or more embodiments, the transistors M4, M5 (switch C1) and M6, M7 (switch C2) can be driven at the nodes E1, E2 via common control terminals (gates, in the case of field effect transistor such as MOS transistor), e.g., via respective buffers 201, 202 supplied between a voltage Vs and a voltage Vs+Vgsw.

The voltage between Vs and the common points E1, E2 of the transistor pairs M4, M5 and M6, M7 may thus be intended to drive in series the gate-source voltages both for the (low-power) "signal" transistors in the switches C1, C2 and for the power transistors M1 or M2.

In that respect, the following relationship may apply:

$$Vgs = VgsM1 + VgsM4$$

where VgsM1 and VgsM4 denote the gate-source voltages of the transistors M1 and M4, respectively, with reference to a worst case, namely the highest current intensity contemplated for the switch 10, minimum models and the highest operating temperature contemplated.

The references 301, 302 designate corresponding level-shifter (of any known type) designed for that purpose.

One or more arrangement as exemplified herein may be advantageous, e.g., as regards the voltage drop across the switch 10.

For instance, by considering the operating condition exemplified in FIG. 3 one may note that a higher gate-to-drain voltage in the transistor M2 will produce a higher current through the transistor (which in this case operates with the drain acting as the source) while the current in the associated body diode will (drastically) reduced.

Consequently, Vds>Vdn.

Across the component M1 a higher voltage drop arise insofar as:

$$Vms = Iin * Rds(on)$$

while Vmn=Vgs (M1) pertaining to the current Iin.

Consequently, Vmn≥Vms

Consequently, in the case of, e.g., a BCD process with DMOS transistors having Vgs (max)=5 V one may estimate $$(Vmn+Vdn)-(Vms+Vds) \text{ about } 1V,$$

where (Vmn+Vdn) and (Vms+Vds) are the voltage drops across the transistors M1 and M2, respectively, in an arrangement according to embodiments and in a conventional arrangement comprising anti-series transistors.

The same remarks apply to the condition exemplified in FIG. 4 by reversing the roles of M1 and M2.

At DC (or in the presence of a relatively low switching frequency), that is when the power dissipated due to conduction dominates over the power dissipated due to switching, certain conventional arrangements may seem more advantageous in terms of power consumption. As noted, these conventional arrangements may be exposed to critical issues due to the current peak produced by diode discharge which may give raise to operation issues for the circuit as a whole.

At higher operating frequencies (e.g., higher than 1-2 MHz) or if the time Ton over which the switch 10 is kept active (namely conductive) is below a few hundred ns, one or more embodiments may provide largely improved performance also in respect of power consumption.

As noted, in certain conventional arrangements the gate current for the (power) transistors is taken from the (positive) power supply so that (the average) dissipated power Pdiss may be expressed as a function of the driver voltage Vdriver in the form:

$$Pdiss(gate) = Vdriver * Igate$$

where Igate is the current (proportional to the switching frequency) which charges/discharges the capacitances associated with the gate terminal.

One or more embodiments may obtain the gate current from the input current, thus avoiding an increase in dissipated power.

Activation of the switch (which may be implemented via low-power "signal" transistors) absorbs a current which is significantly lower insofar as these transistors may be sized to have an overall size which is, e.g., about 1/30 size of the power transistors M1, M2.

Also, the current loss toward the substrate as produced by the P-channel parasitics associated with the diode will be lower due to the current through the diode being itself lower.

This factor further contributes to reducing global power dissipation.

Due to the reduced current to be handled via the switches such as C1, C2 designing the corresponding driver circuits is made correspondingly simpler.

A circuit (e.g., 10) according to one or more embodiments may comprise:

a first (e.g., M1) and a second (e.g., M2) transistor having their control electrodes (e.g., gates, in the exemplary case of field effect transistors) coupled at a first common node (e.g., A) and the current paths therethrough (e.g., source-drain in the exemplary case of field effect transistors) coupled at a second common node (e.g., B) in an anti-series arrangement, a first electrical path between the first common node and the current path through the first transistor (at the terminal, e.g., drain) opposed the second transistor, the first electrical path comprising a first switch (e.g., C1) switchable (e.g., S2) between a conductive state and a non-conductive state, a second electrical path between the first common node and the current path through the second transistor (at the terminal, e.g., drain) opposed the first transistor, the second electrical path comprising a second switch (e.g., C2) switchable (e.g., S1) between a conductive state and a non-conductive state, a third electrical path between the first common node and the second common node, the third electrical path comprising a third switch (e.g., C3) switchable between a conductive state and a non-conductive state, a logical network (e.g., 12) coupling the third switch with the first and second switches, the logical network configured to switch the third switch:

a) to the conductive state with both the first switch and the second switch switched to the non-conductive state, b) to the non-conductive state with either one of the first switch and the second switch switched to the conductive state.

In one or more embodiments, the first transistor and the second transistor may comprise MOS transistors.

In one or more embodiments, the first transistor and the second transistor may have their current generation terminals (e.g., sources, in the exemplary case of field effect transistors) coupled at the second common node (B).

In one or more embodiments, the logical network may comprises a NAND gate sensitive to the conductive resp. non-conductive state of the first and second switches, the NAND gate configured to control (e.g., via its output) the conductive resp. non-conductive state of the third switch.

In one or more embodiments, the first, second and third switches may comprise (low-power or "signal") MOS transistors (e.g., M4, M5; M6, M7; M3).

In one or more embodiments:

the first switch and the second switch may comprise respective pairs of transistors (e.g., M4, M5 and M6, M7) coupled in an anti-series arrangement;

the third switch may comprises a single transistor (e.g., M3).

One or more embodiments may comprise:

first (e.g., S2) and second (e.g., S1) switch control nodes coupled to the first switch and the second switch, respectively, where the first and the second switch control nodes are jointly coupled (e.g., via the gate 12) to the third switch, level shifters (e.g., 121, 122 and 301, 302) set between the switch control nodes and the first and second switches.

An electronic device (D) according to one or more embodiments suitable of comprising a circuit according to one or more embodiments may comprise a switching (class-D) amplifier (D).

In one or more embodiments, a method of controlling current flow between a first electrical line node (e.g., Va) and a second electrical line node (e.g., Vb) may comprise:

arranging a circuit according to one or more embodiments with the current paths through the first and the second transistors providing a current line between the first and the second electrical line nodes, and switching the first and the second switch in the circuit to an operating condition selected out of:

i) a first operating condition, where the first and the second switch are non-conductive, thereby impeding current flow in the current line between the first and the second electrical line nodes with the third switch conductive;

ii) a second operating condition, where the first switch is conductive and the second switch is non-conductive with the third switch non-conductive, thereby facilitating current flow in the current line from the first to the second electrical line node, iii) a third operating condition, where the first switch is non-conductive and the second switch is conductive with the third switch non-conductive, thereby facilitating current flow in the current line from the second to the first electrical line node.

Without prejudice to the underlying principles, the details and embodiments may vary, even significantly, without departing from the extent of protection. The extent of protection is determined by the annexed claims.

What is claimed is:

1. A circuit comprising:
   first and second transistors having respective control electrodes coupled to a first common node, and respective current paths coupled to a second common node in an anti-series arrangement, wherein a first current path electrode of the first transistor is coupled to the second common node and a first current path electrode of the second transistor is coupled to the second common node;
   a first switch coupled between the first common node and a second current path electrode of the first transistor;
   a second switch coupled between the first common node and a second current path electrode of the second transistor;
   a third switch coupled between the first common node and the second common node; and
   a logical network coupling the third switch with the first and second switches, the logical network configured to switch the third switch to a conductive state when the first switch and the second switch are in a non-conductive state, and to switch the third switch to a non-conductive state when the first switch or the second switch is in a conductive state.

2. The circuit of claim 1, wherein the first transistor and the second transistor comprise metal-oxide semiconductor (MOS) transistors.

3. The circuit of claim 1, wherein the first transistor and the second transistor have respective current generation terminals coupled to the second common node.

4. The circuit of claim 1, wherein the logical network comprises a NAND gate having an output configured to control the third switch, a first input coupled to the first switch, and a second input coupled to the second switch.

5. The circuit of claim 1, wherein the first, second, and third switches comprise metal-oxide semiconductor (MOS) transistors.

6. The circuit of claim 1, wherein:
   the first switch comprises a pair of transistors coupled in an anti-series arrangement; and
   the second switch comprises a pair of transistors coupled in an anti-series arrangement.

7. The circuit of claim 1, further comprising:
first and second switch control nodes coupled to the first and second switches, respectively, wherein the first and second switch control nodes are jointly coupled to the third switch; and
level shifters respectively coupled between the first and second switch control nodes and the first and second switches.

8. The circuit of claim 1, wherein the circuit is part of a class-D amplifier.

9. A method of controlling current flow between a first terminal and a second terminal using a circuit coupled between the first terminal and the second terminal, the circuit comprising first and second transistors having respective control electrodes coupled to a first common node, and respective current paths coupled to a second common node in an anti-series arrangement, wherein a first current path electrode of the first transistor is coupled to the second common node, a second current path electrode of the first transistor is coupled to the first terminal, a first current path electrode of the second transistor is coupled to the second common node, and a second current path electrode of the second transistor is coupled to the second terminal; the method comprising:
receiving a first signal and a second signal; and
selecting an operating condition of the circuit from a plurality of operating conditions based on the first and second signals, wherein the plurality of operating conditions comprises:
a first operating condition in which the control electrodes of the first and second transistors are connected to the first current path electrodes of the first and second transistors and disconnected from the second current path electrodes of the first and second transistors to prevent current flow between the first and second terminals,
a second operating condition in which the control electrodes of the first and second transistors are connected to the first terminal and disconnected from the first current path electrodes of the first and second transistors to facilitate current flow from the first terminal to the second terminal, and
a third operating condition in which the control electrodes of the first and second transistors are connected to the second terminal and disconnected from the first current path electrodes of the first and second transistors to facilitate current flow from the second terminal to the first terminal.

10. The method of claim 9, wherein:
selecting the first operating condition comprises:
turning off a first switch coupled between the first common node and the first terminal,
turning off a second switch coupled between the first common node and the second terminal, and
turning on a third switch coupled between the first common node and the second common node;
selecting the second operating condition comprises:
turning on the first switch,
turning off the second switch, and
turning off the third switch; and
selecting the third operating condition comprises:
turning off the first switch,
turning on the second switch, and
turning off the third switch.

11. The method of claim 9, wherein selecting the operating condition of the circuit comprises:

controlling a first switch coupled between the first common node and the first terminal with the first signal;
controlling a second switch coupled between the first common node and the second terminal with the second signal; and
controlling a third switch coupled between the first common node and the second common node with an output of a logic circuit that receives the first signal at a first input and the second signal at a second input.

12. The method of claim 11, wherein the first and second switches comprises respective pairs of transistors in an anti-series arrangement.

13. The method of claim 12, wherein the pairs of transistors of the first and second switches are n-type transistors, and wherein the third switch comprises an n-type transistor.

14. The method of claim 11, wherein the logic circuit comprises a NAND gate.

15. A bi-directional switch comprising:
a first terminal;
a second terminal;
a first input terminal;
a second input terminal;
first and second transistors having respective control electrodes coupled to a first common node, and respective current paths coupled to a second common node in an anti-series arrangement, wherein a first current path electrode of the first transistor is coupled to the second common node, a second current path electrode of the first transistor is coupled to the first terminal, a first current path electrode of the second transistor is coupled to the second common node, and a second current path electrode of the second transistor is coupled to the second terminal;
a first switch coupled between the first common node and the first terminal, the first switch having a control terminal coupled to the first input terminal;
a second switch coupled between the first common node and the second terminal, the second switch having a control terminal coupled to the second input terminal;
a logic circuit having a first input coupled to the first input terminal and a second input coupled to the second input terminal; and
a third switch coupled between the first common node and the second common node, the third switch having a control terminal coupled to an output of the logic circuit.

16. The bi-directional switch of claim 15, wherein the first switch comprises a first pair of transistors in an anti-series arrangement, and wherein the second switch comprises a second pair of transistors in an anti-series arrangement.

17. The bi-directional switch of claim 16, wherein the first pair of transistors and the second pair of transistors are metal-oxide semiconductor (MOS) transistors of the n-type, and wherein the third switch comprises a MOS transistor of the n-type.

18. The bi-directional switch of claim 15, wherein the logic circuit comprises a NAND gate.

19. The bi-directional switch of claim 15, further comprising a first level shifter coupled between the control terminal of the first switch and the first input terminal and a second level shifter coupled between the control terminal of the second switch and the second input terminal.

20. The bi-directional switch of claim 15, wherein the first and second transistors are power metal-oxide semiconductor (MOS) transistors.

21. The bi-directional switch of claim 20, wherein the first current path electrodes of the first and second transistors comprises respective source electrodes, and wherein the second current path terminals of the first and second transistors comprises respective drain electrodes.

22. The bi-directional switch of claim 15, wherein the first and second transistors are transistors of the n-type.

* * * * *